(12) United States Patent
Daniel et al.

(10) Patent No.: US 8,813,338 B2
(45) Date of Patent: Aug. 26, 2014

(54) WORKPIECE ALIGNMENT DEVICE

(75) Inventors: Malcolm N. Daniel, Austin, TX (US); Charles T. Carlson, Cedar Park, TX (US); William T. Weaver, Austin, TX (US)

(73) Assignee: Varian Semiconductor Equipment Associates, Inc., Gloucesler, MA (US)

( * ) Notice: Subject to any disclaimer, the term of this patent is extended or adjusted under 35 U.S.C. 154(b) by 61 days.

(21) Appl. No.: 13/415,411

(22) Filed: Mar. 8, 2012

(65) Prior Publication Data

US 2012/0227233 A1    Sep. 13, 2012

Related U.S. Application Data

(60) Provisional application No. 61/451,872, filed on Mar. 11, 2011.

(51) Int. Cl.
*B23P 21/00* (2006.01)
*B65G 65/00* (2006.01)

(52) U.S. Cl.
USPC ........... 29/430; 29/822; 414/331.14; 414/937

(58) Field of Classification Search
USPC ............ 29/430, 890.033, 822–924; 408/1 R; 414/331.17, 217, 416.03, 788, 937
See application file for complete search history.

(56) References Cited

U.S. PATENT DOCUMENTS

| | | | | |
|---|---|---|---|---|
| 3,898,716 | A * | 8/1975 | Aylott | 24/573.11 |
| 6,183,186 | B1 | 2/2001 | Howells et al. | |
| 8,065,784 | B2 * | 11/2011 | Lu et al. | 29/564 |
| 8,337,134 | B2 * | 12/2012 | Greber et al. | 414/416.03 |
| 2006/0050437 | A1 * | 3/2006 | Shiga et al. | 360/133 |

FOREIGN PATENT DOCUMENTS

JP    2008251921 A    10/2008

* cited by examiner

*Primary Examiner* — David Bryant
*Assistant Examiner* — Jun Yoo

(57) ABSTRACT

An alignment device has a carriage, two rails on the carriage that are configured for a workpiece to pass therebetween, and a finger that protrudes a distance from the carriage. The finger is configured to be disposed on a carrier for the workpieces. The workpieces may be solar cells and may pass through the rails on a conveyor belt. The alignment device may move in order to align the workpieces as the workpieces are loaded into a carrier.

8 Claims, 10 Drawing Sheets

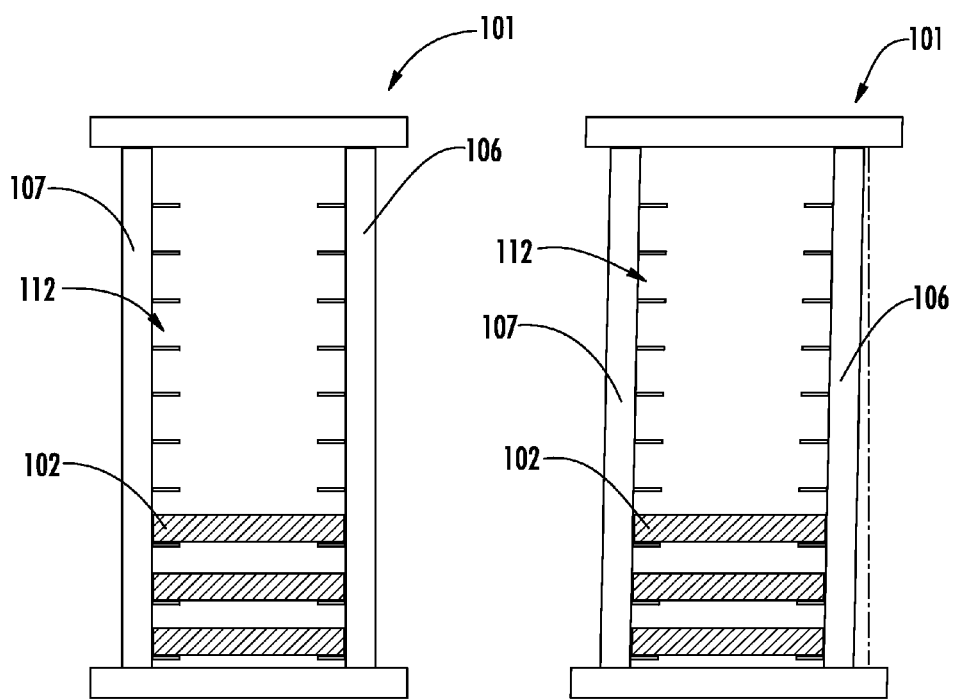

WORKPIECE ALIGNMENT DEVICE

CROSS-REFERENCE TO RELATED APPLICATIONS

This claims priority to the provisional patent application entitled "Solar Cell Workpiece Alignment Device," filed Mar. 11, 2011 and assigned U.S. App. No. 61/451,872, the disclosure of which is hereby incorporated by reference.

FIELD

This invention relates to alignment of workpieces into a carrier and, more particularly, to alignment of solar cell workpieces into a carrier.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the ion beam penetrate into the bulk of the workpiece material and are embedded into the crystalline lattice of the workpiece material to form a region of desired conductivity.

Solar cells are one example of a workpiece. Lower production costs for high-performance solar cells or any efficiency improvement to high-performance solar cells would have a positive impact on the implementation of solar cells worldwide. This will enable the wider availability of a clean energy technology. Ion implantation is one way to improve efficiency of solar cells. Solar cells or other workpieces may be loaded into a carrier after processing in an ion implanter or other piece of processing equipment.

Loading workpieces, such as solar cells, into a carrier from an ion implanter or other piece of processing equipment may have multiple drawbacks. The solar cell industry does not have well-defined standards for sizing or tolerances of solar cell workpieces or the carriers that transport these workpieces. There may be a wide variation in alignment and clearances between the workpieces and the carriers due to the lack of standardization. This also may lead to problems when loading workpieces into the carriers. Differences in workpiece sizes or carrier dimensions may result in improperly-loaded workpieces or even workpiece breakage during loading.

Besides the lack of well-defined standards, workpiece loading into carriers may be affected by machine setup, calibration, alignment, and consistency between carriers. Manufacturer tolerances are one factor in consistency between carriers. Thus, there may be differences in dimensions of the carriers from a single manufacturer. Deformation of the carrier caused by chemical processing, other wet processing, or mechanical forces is another factor in consistency between carriers. Attempts to use carriers from multiple manufacturers in a single tool also may affect consistency between carriers because each manufacturer's carrier may have different dimensions or specifications. Loading a workpiece into a deformed carrier or into carriers from different manufacturers also may result in improperly-loaded workpieces or workpiece breakage.

If the workpieces are not loaded correctly in the carrier, then the workpieces may end up in the processing equipment or on the floor. Throughput or productivity within the facility may be affected due to missing workpieces in the carrier. Workpieces also may be broken during processing if loaded incorrectly. This increases a manufacturer's material costs. Thus, there is a need in the art for an improved alignment device or an improved alignment method for loading workpieces or, more particularly, for solar cell workpieces.

SUMMARY

According to a first aspect of the invention, an alignment device is provided. The alignment device comprises a carriage, two rails on the carriage that are configured for a workpiece to pass therebetween, and a finger that protrudes a distance from the carriage and is configured to be disposed on a carrier for the workpiece.

According to a second aspect of the invention, a workpiece loading apparatus is provided. The apparatus comprises a conveyor belt, a carrier configured to hold workpieces, a carriage, two rails disposed a distance apart on the carriage that are positioned above the conveyor belt, and a finger protruding from the carriage that is configured to be disposed on the carrier.

According to a third aspect of the invention, a method of alignment is provided. The method comprises transporting a plurality of workpieces on a conveyor belt toward a carrier. The carrier is moved in a first direction such that the workpieces are disposed within multiple positions in the carrier. A finger of an alignment device runs along the carrier during the moving. Each workpiece is aligned on the conveyor belt in a plane perpendicular to the first direction using the alignment device while the finger runs along the carrier.

BRIEF DESCRIPTION OF THE DRAWINGS

For a better understanding of the present disclosure, reference is made to the accompanying drawings, which are incorporated herein by reference and in which:

FIG. 1 is a front view of a first example of a carrier;

FIG. 2 is a front view of a second example of a cattier;

DETAILED DESCRIPTION

These embodiments are described herein in connection with an ion implanter. However, these embodiments can be used with other systems and processes involved in workpiece manufacturing. While solar cells are specifically listed, these embodiments also may be applied to other workpieces, such as semiconductors or light-emitting diodes (LEDs). While a specific carrier design is illustrated, other designs such as those having a wall around three sides of the carrier, two parallel walls, five posts, or six posts instead of the illustrated four posts are possible. Thus, the invention is not limited to the specific embodiments described below.

The alignment device disclosed herein enables alignment of workpieces, such as solar cell workpieces, to carriers or cassettes despite any drawbacks previously mentioned. Alignment may increase productivity or reduce material costs. The alignment device disclosed herein also loosens the tolerance window for carrier alignment during the setup and calibration of any tool, which may increase productivity in a facility.

FIG. 1 and FIG. 2 are front views of carrier examples. FIG. 1 is a first example of a carrier 101. Multiple workpieces 102 may be held in any carrier 101. Three workpieces 102 are illustrated in the carrier 101 in FIGS. 1-2 as an example. Workpieces 102 rest on the ledges 112 on or in the posts 106, 107. Thus, the carrier 101 is a rack or series of shelves that can hold the workpieces 102. The carrier 101 may have varied dimensions between different manufacturers or even with the same manufacturer. Thus, the position of the posts 106, 107 or width of the posts 106, 107 may vary. The example of the carrier 101 in FIG. 2 is bent or warped, as illustrated by the dotted line. The posts 106, 107 have been damaged or bowed due to mechanical, chemical, or some other processing. Since the posts 106, 107 are not straight like the carrier 101 example in FIG. 1, placement when loading workpieces 102 on the ledges 112 of the carrier 101 example in FIG. 2 is difficult because the ledges 112 and posts 106, 107 vary from the expected position due to this warping. This may lead to broken workpieces 102 during loading or may result in workpieces 102 not being loaded on all the ledges 112 of the carrier 101 of FIG. 2.

Figure 3:
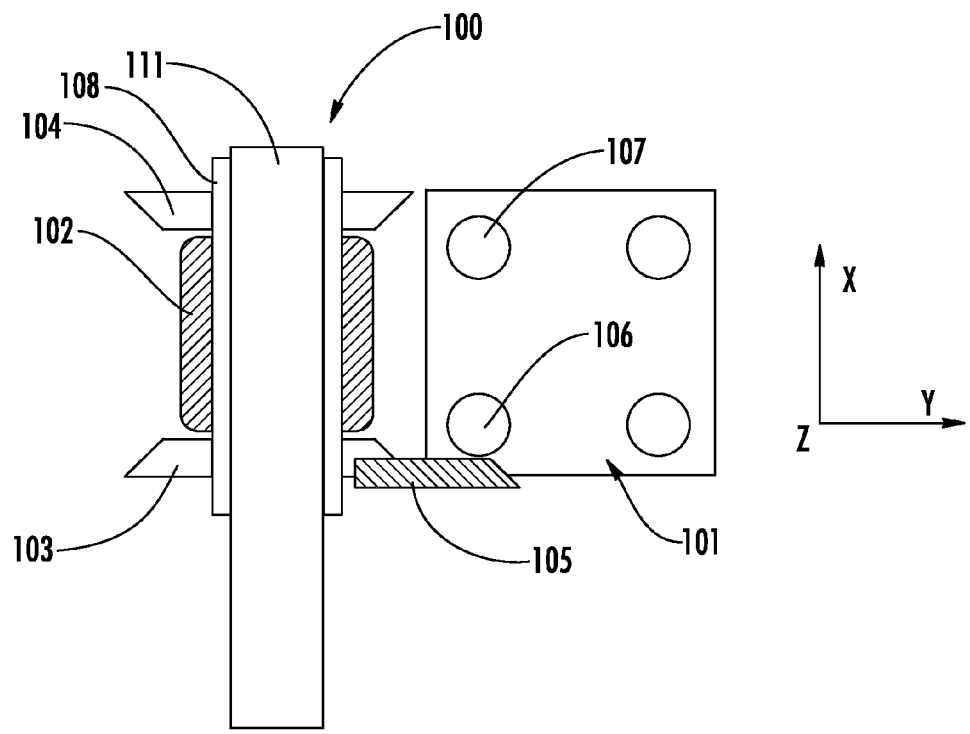
FIGS. 3-4 are a top view and corresponding side view of a first embodiment of an alignment device with a carrier.
Figure 4:
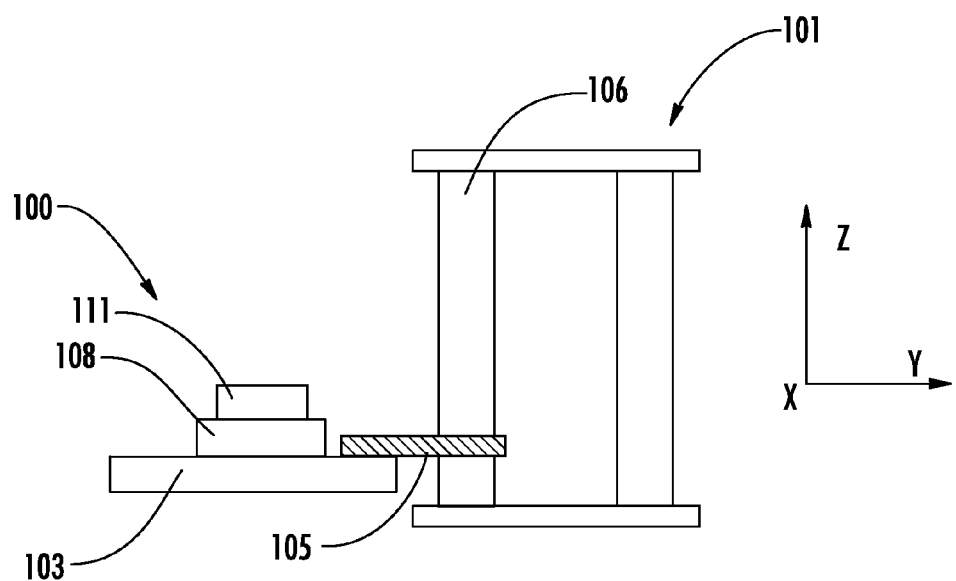

FIGS. 3-4 are a top view and corresponding side view of a first embodiment of an alignment device with a carrier. The alignment device 100 is proximate the carrier 101. Portions of this carrier 101 may have been deformed due to mechanical or chemical forces or this carrier 101 may have different dimensions from other carriers. The alignment device 100 connected to an arm 111 ensures that the workpiece 102 is loaded correctly into the carrier 101. The finger 105 runs along or against the post 106 of the carrier 101.

The workpieces 102 coming from an ion implanter or some other piece of processing equipment may be fed into the carrier 101 through the alignment device 100 in the Y-direction, such as by using a conveyor belt. As the workpieces 102 pass through the alignment device 100, the alignment device 100 will ensure the workpieces 102 are properly positioned in the carrier 101 using the rails 103, 104 that are connected to the carriage 108. This carrier 101 may have ledges as illustrated in FIGS. 1-2. The alignment device 100 may move in the X-direction. The carrier 101 may move in the Z-direction to enable loading of all positions within the carrier 101.

Figure 5:
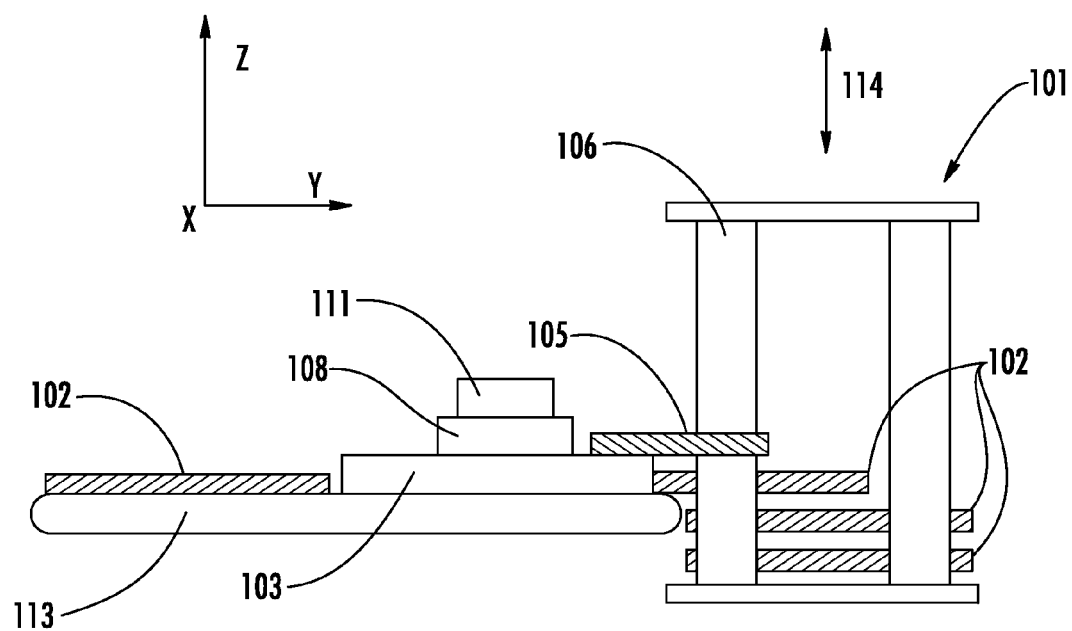
FIG. 5 is a side view of the alignment device of FIGS. 3-4 loading workpieces into a carrier.

FIG. 5 is a side view of the alignment device of FIGS. 3-4 loading workpieces into a carrier. In FIG. 5, the workpieces 102 are transported in the Y-direction using the conveyor belt 113. These workpieces 102 are loaded into the carrier 101 by moving the carrier 101 in the Z-direction, as illustrated by the arrow 114. The carrier 101 may be moved using an elevator or robot, for example.

Figure 6:
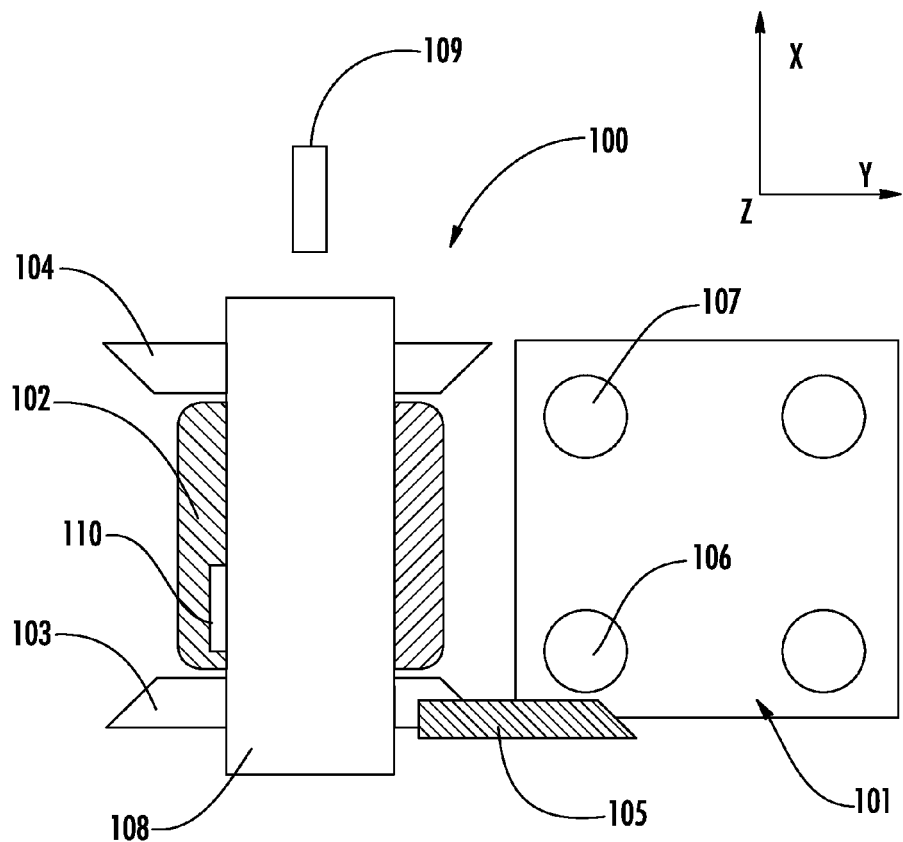
FIG. 6 is another top view of the alignment device of FIGS. 3-4.

FIG. 6 is another top view of the alignment device of FIGS. 3-4. The alignment device 100 contains a workpiece 102 between two rails 103, 104. The rails 103, 104 abut or are proximate the carrier 101 and, in one embodiment, are mirror images. These rails 103, 104 may be adjustable and guide the movement or trajectory of the workpiece 102. These rails 103, 104 may be connected directly to the carriage 108. In another instance, the rails 103, 104 may be connected to a bracket that is connected to the carriage 108. This carriage 108 may be metal or plastic, for example.

The surface of the rails 103, 104 facing the workpiece 102 may be flat. In an alternate embodiment, the rails 103, 104 may contain grooves or be shaped to enable smooth movement of the workpiece 102. In one particular embodiment, the rails 103, 104 may be tapered to provide smooth movement of the workpiece 102 to the aligned position. The rails 103, 104 may be fabricated of PEEK (polyether ether ketone) or a plastic such as TORLON® PAI (polyamide-imide) (manufactured by Solvay Plastics) to ensure smooth movement of the workpiece 102. Other materials known to those skilled in the art may be used for the rails 103, 104. The material of the rails 103, 104 may be selected in one instance to not increase metal contamination of the workpiece 102. The rails 103, 104 may be longer than a width of a workpiece 102 in one instance, though other dimensions are possible.

The finger 105 runs against the post 106. This helps position the alignment device 100 with respect to the post 106 even if the posts 106, 107 are damaged, warped, or different sizes from the previous carrier 101 that was loaded. If the position of the post 106 changes in the X-direction, the alignment device 100 moves in the X-direction in a corresponding manner. This finger 105 may be fabricated of Teflon to ensure it rides smoothly against the post 106 or does not stick to the post 106. The finger 105 is connected to the rail 103 in the embodiment illustrated in FIG. 6. In another embodiment, the finger 105 is connected to the carriage 108. In this embodiment, the carriage 108 may have a shape that covers part of the rail 103 or a protrusion so that the finger 105 can extend from the alignment device 100. A screw and nut, for example, may be used to lock the finger 105 in place, but the finger 105 may slide or be adjustable in the X-direction to accommodate different carriers 101.

The alignment device 100 also has a carriage 108. In one instance, the carriage 108 is spring-loaded. The carriage 108 is connected to a spring 110 that is connected to the arm 111 (as illustrated in FIG. 3) of the alignment device 100. The arm 111 may be fixed in this embodiment and the carriage 108 may be moveable in the X-direction with respect to the arm 111. The spring 110 may be positioned in the rear of the alignment device 100 or the point farthest from the carrier 101 in one instance, though other locations are possible. A screw 109 or other mechanism limits travel of the carriage 108 in the X-direction. This may, for example, prevent a workpiece 102 from falling off a conveyor belt. The carriage 108 keeps the finger 105 in contact with the post 106 such as by using the spring 110. The tension of the spring 110 will press the finger 105 against the post 106. As the finger 105 runs against the post 106, such as if the carrier 101 moves in the Z-direction, any variations in the post 106 will cause the alignment device 100 to move in the X-direction and align the workpiece 102 to the region between the posts 106, 107. As the carrier 101 moves with respect to the alignment device 100 so it can be fully loaded, any inconsistencies in the carrier 101 are accommodated because the carriage 108 and finger 105 follow the post 106 to maintain proper alignment. This allows for fewer machine interrupts, higher throughput, and fewer broken workpieces 102.

Figure 7A:
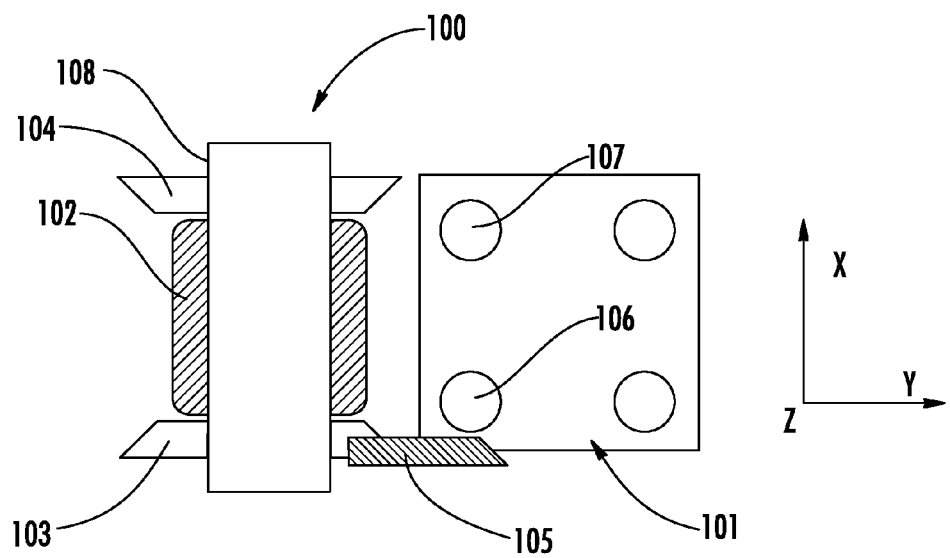
FIGS. 7A-C are top views illustrating the operation of the alignment device of FIGS. 3-4.
Figure 7B:
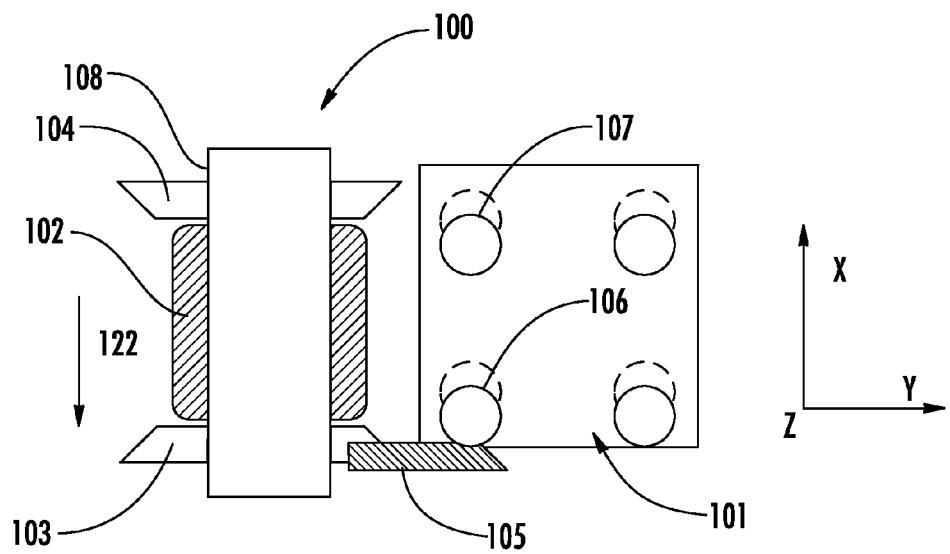
Figure 7C:
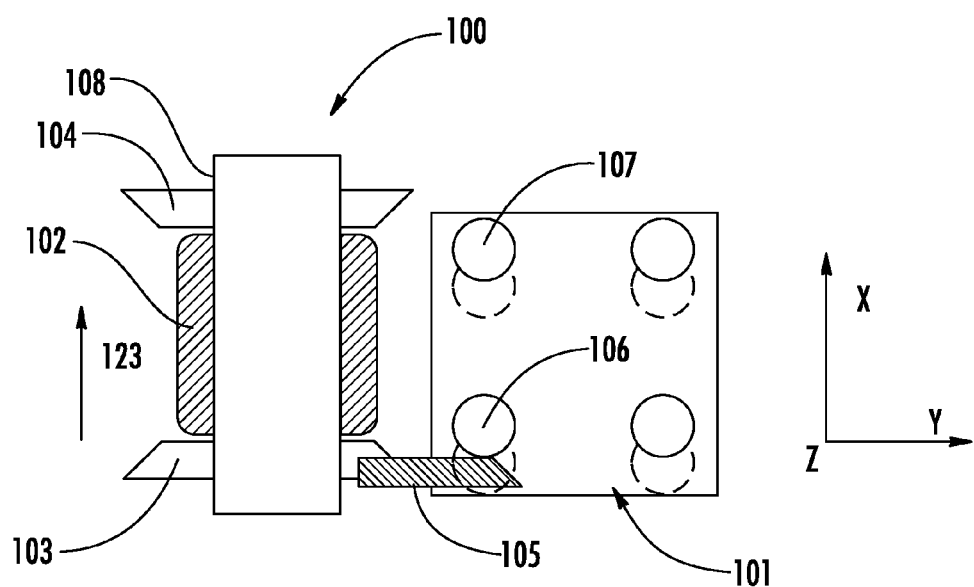

FIGS. 7A-C are top views illustrating the operation of the alignment device of FIGS. 3-4. In FIG. 7A, the posts 106, 107 are in a first position in the X-direction. This may correspond to a certain level or height of the carrier 101 in the Z-direction. In FIG. 7B, the posts 106, 107 at a different level or height of the carrier 101 are in a second position in the X-direction with respect to the first position (shown with dotted lines). For example, the posts 106, 107 may have warped during chemical processing. The finger 105 is pressed against or rides against the post 106 as the carrier 101 moves in the Z-direction. Thus, the alignment device 100 moves in the X-direction as shown by the arrow 122. This movement shown by the arrow 122 will allow the workpiece 102 to be aligned with the posts 106, 107 and prevents breakage, incorrect loading, or loss of the workpiece 102. In FIG. 7C, the posts 106, 107 at a different level or height of the carrier 101 are in a third position in the X-direction with respect to the second position (shown with dotted lines). The finger 105 again will cause the alignment, device 100 to move in the X-direction as shown by the arrow 123. This movement shown by the arrow 123 will allow the workpiece 102 to be aligned with the posts 106, 107 and prevents breakage, incorrect loading, or loss of the workpiece 102. As the posts 106, 107 vary within a carrier 101 or between different carriers 101, the finger 105 and alignment device 100 ensure proper loading of the workpiece 102.

Figure 8:
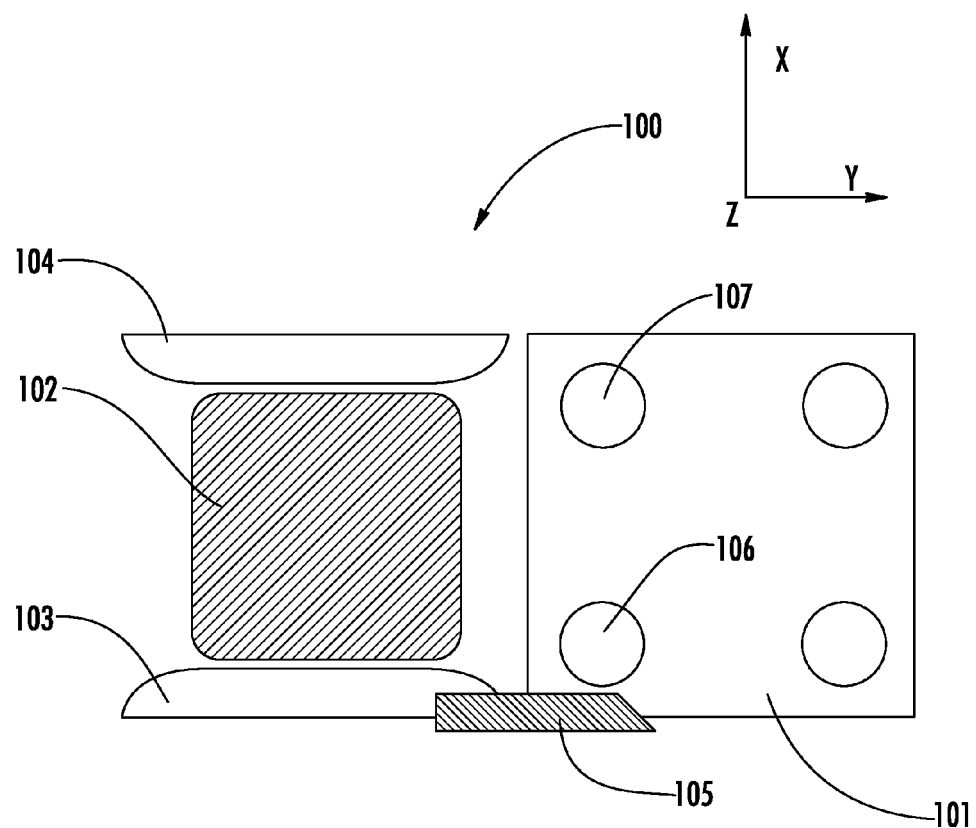
FIG. 8 is a top view of a second embodiment of an alignment device with a carrier.

FIG. 8 is a top view of a second embodiment of an alignment device with a carrier. Instead of the angular corners of the rails 103, 104 illustrated in FIG. 6, the rails 103, 104 of FIG. 8 are curved or tapered. This may assist in alignment and prevent jamming of the workpiece 102 within the alignment device 100. The curvature of the rails 103, 104 may vary from that illustrated in FIG. 8 and other designs are possible.

Figure 9:
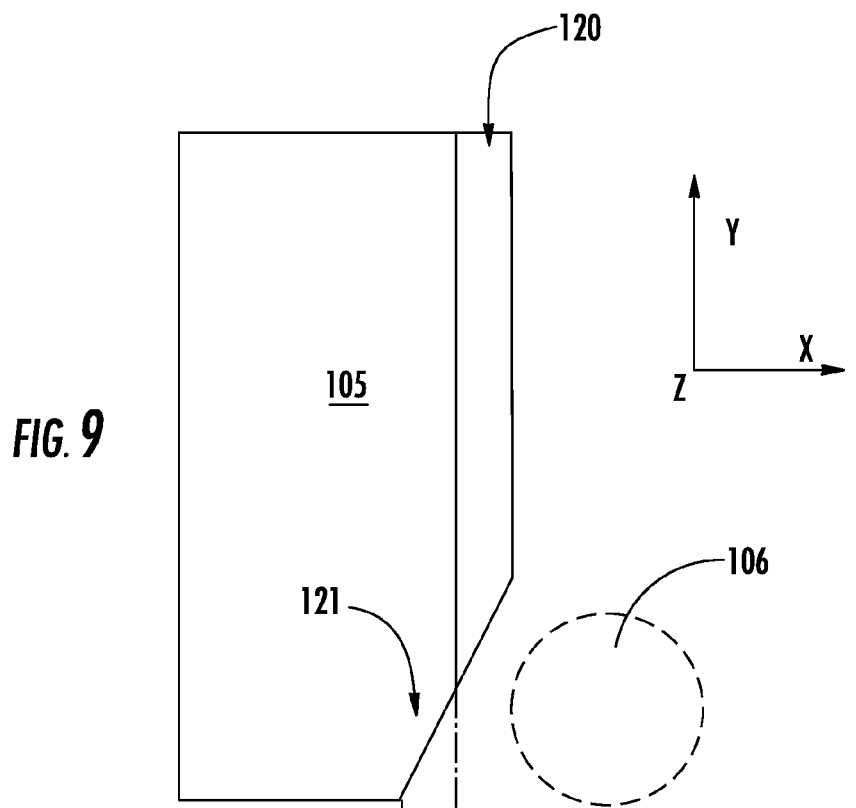
FIGS. 9-10 are a top view and corresponding front view of a finger.
Figure 10:
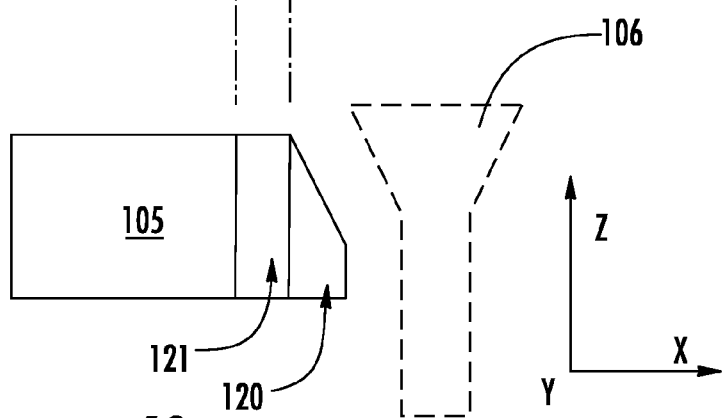

FIGS. 9-10 are a top view and corresponding front view of a finger. In this particular embodiment, the finger 105 includes as angled front face 121 and a beveled surface 120. The angled front face 121 engages with the post 106 (illustrated with a dotted line in FIGS. 9-10) when the finger 105 or post 106 is moved in the Y-direction. The beveled surface 120 enables the finger 105 to engage a post 106 that has a curved or angled top as illustrated in FIG. 10. Thus, when the post 106 moves in the Z-direction with respect to the finger 105, the finger 105 will not snag or bend when contacting this post 106. Of course, other designs of the finger 105 are possible.

Figure 11:
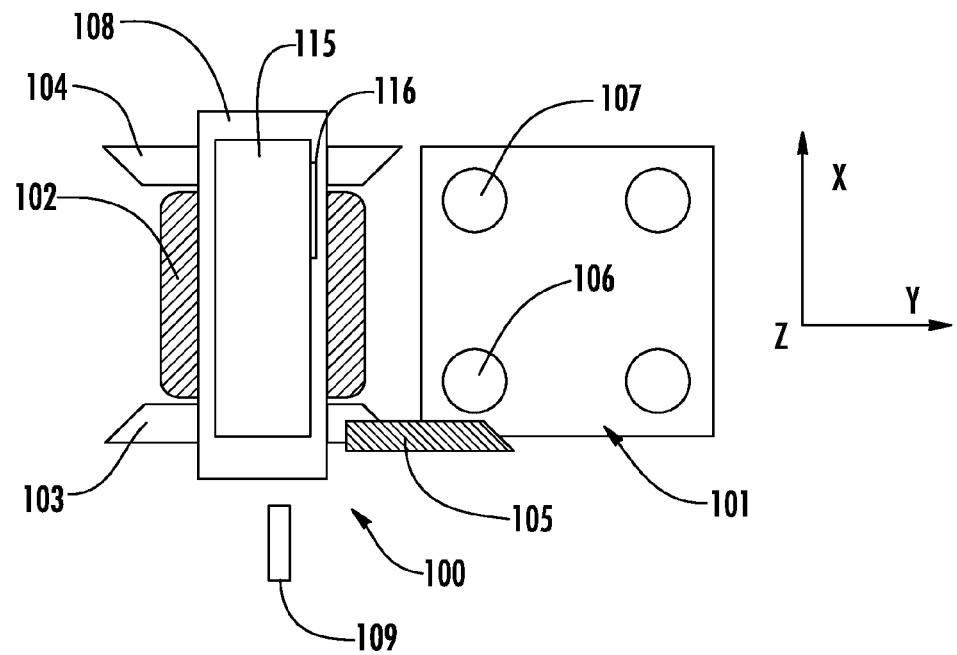
FIGS. 11-12 are a top view and a corresponding side view of a third embodiment of an alignment device with a carrier.
Figure 12:
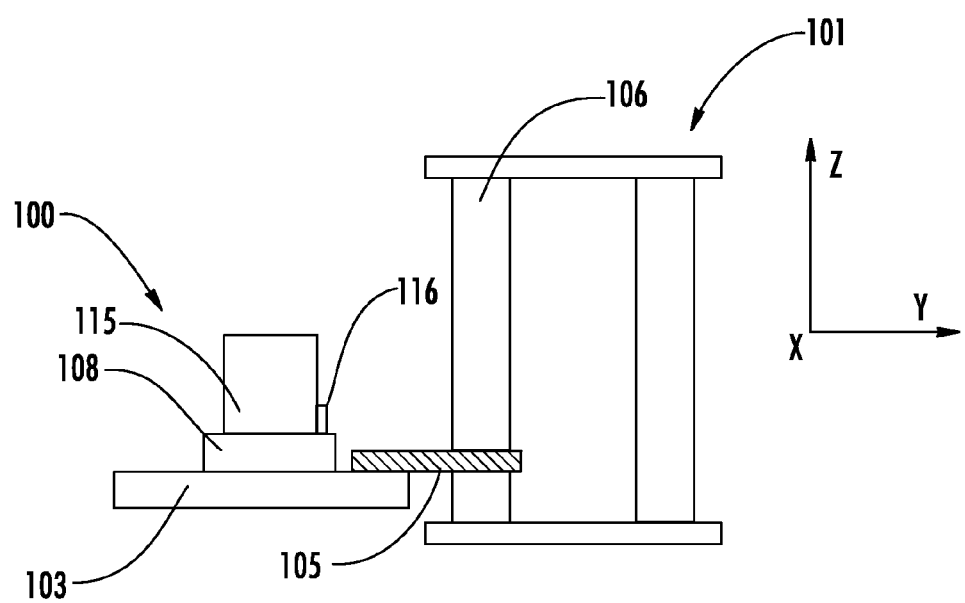

FIGS. 11-12 are a top view and a corresponding side view of a third embodiment of an alignment device with a carrier. In this embodiment, the carriage 108 is connected to an actuator 115. This actuator 115 may be fixed in the X-direction. A spring 116 is connected between the actuator 115 and the carriage 108. The carriage 108 may move in the X-direction. In one instance, wheels on the carriage 108 ride against the actuator 115. The actuator 115 may have a track or rail on which these wheels may ride. The spring 116 provides tension that presses the finger 105 against the post 106 of the carrier 101. A screw 109 or other mechanism limits travel of the carriage 108 in the X-direction.

Figure 13:
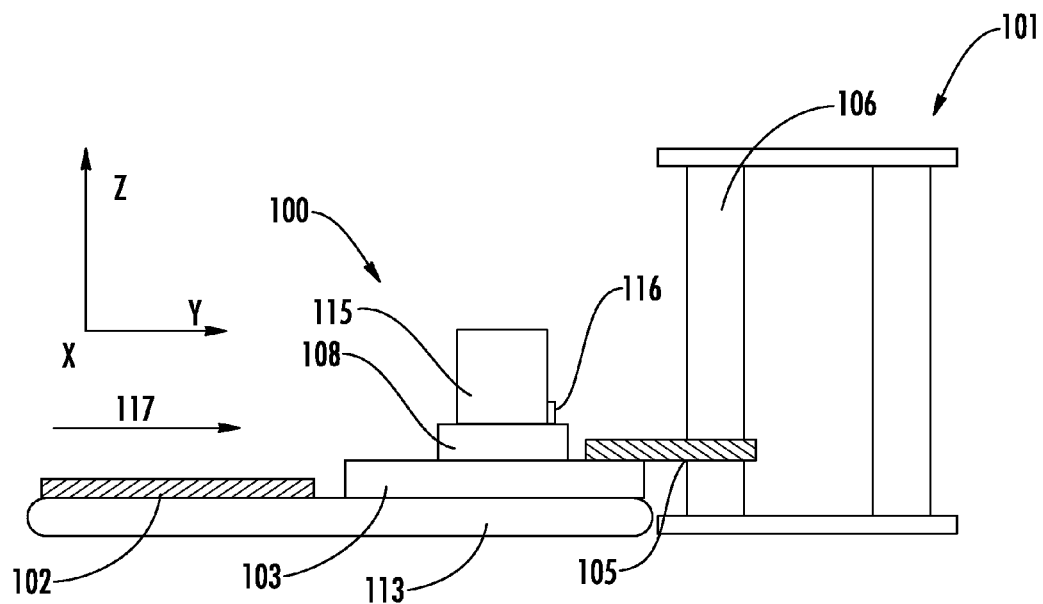
FIGS. 13-14 are side views of the alignment device of FIGS. 11-12 loading workpieces into a carrier and unloading workpieces from a carrier.
Figure 14:
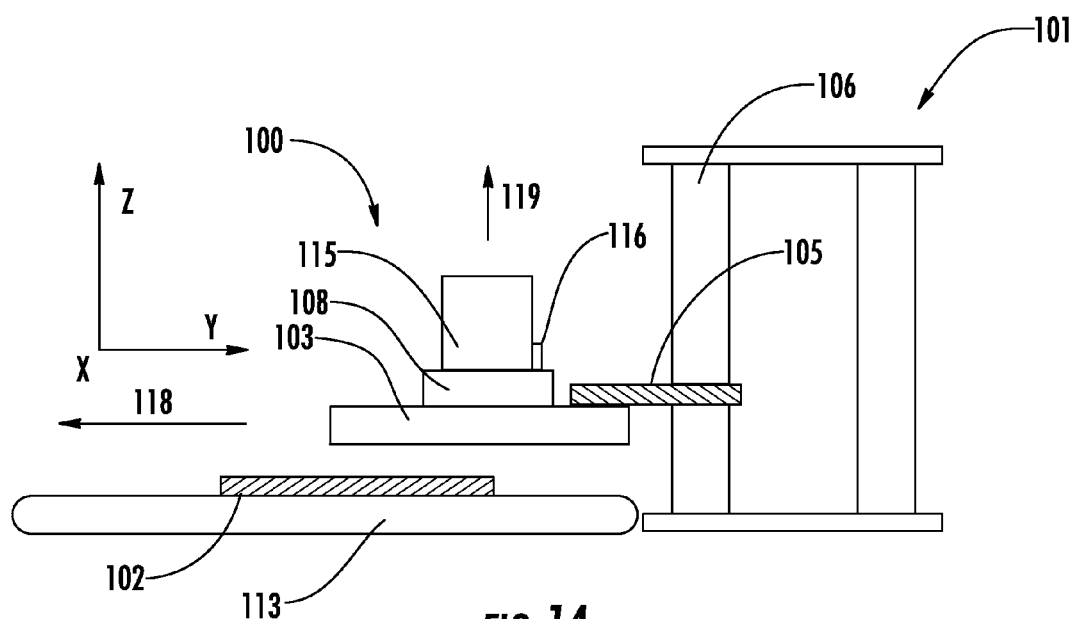

FIGS. 13-14 are side views of the alignment device of FIGS. 11-12 loading workpieces into a carrier and unloading workpieces from a carrier. The actuator 115 can move the alignment device 100 in the Z-direction. When the workpieces 102 are loaded into the carrier 101 using the conveyor belt 113 as illustrated by the arrow 117 in FIG. 13, the alignment device 100 is positioned to align workpiece 102 as these are loaded into the carrier 101. When the workpieces 102 are unloaded from the carrier 101 using the conveyor belt 113 as illustrated by the arrow 118 in FIG. 14, the actuator 115 moves the alignment device as illustrated by the arrow 119. This moves the alignment device 100 farther from the conveyor belt 113 such that workpieces 102 unloaded from the carrier 101 do not contact the alignment device 100 or are not aligned by the alignment device 100. This may prevent jamming within the alignment device 100. The actuator 115 may position the alignment device 100 back into the position illustrated in FIG. 12 once unloading of the carrier 101 is complete or before loading of the carrier 101 begins.

Over time, the workpieces 102 may cut into the rails 103, 104. Any grooves or damage to the rails 103, 104 may cause jamming of workpieces 102 within the alignment device 100. The actuator 115 of FIGS. 11-14 may adjust or compensate for this damage. As the workpieces 102 cut into the rails 103, 104, the actuator 115 moves the alignment device 100 in the Z-direction so that the workpieces 102 begin wearing against another portion of the rails 103, 104. This extends the life of the rails 103, 104, reduces consumable costs, and increases reliability of the alignment device 100. Of course, the rails 103, 104 also may be adjusted manually in the Z-direction, such as using a screw and nut.

During setup, jigs may be used to position the finger 105 against the post 106 and to guide the rails 103, 104 to ensure the workpiece 102 enters the carrier 101 properly. A jig also may be used with position the finger 105 with respect to one or both rails 103, 104. In one instance, the initial position of the finger 105 is such that the carrier 101 does not contact the finger 105 when docking but contacts the finger 105 when clamped or locked in place for loading or unloading of workpieces.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A workpiece loading apparatus comprising:
   a conveyor belt;
   a carrier configured to hold workpieces;
   a carriage, disposed between said conveyor belt and said carrier and configured to move in a first direction perpendicular to said conveyor belt;
   two rails disposed a distance apart on said carriage, said rails positioned above said conveyor belt and configured for a workpiece to pass therebetween; and
   a finger protruding from said carriage, wherein said carrier is biased in said first direction so that said finger is configured to contact said carrier.

2. The apparatus of claim 1, wherein said workpieces are solar cells.

3. The apparatus of claim 1, wherein said carrier is configured to move in a second direction perpendicular to said first direction and perpendicular to said conveyor belt.

4. The apparatus of claim 1, wherein said rails are fabricated of a material that comprises PEEK and wherein said finger is fabricated of a material that comprises Teflon.

5. The apparatus of claim 1, further comprising:
   an arm connected to said carriage; and
   a spring between said carriage and said arm to bias said finger toward said carrier.

6. The apparatus of claim 1, further comprising an actuator to move said carriage in a second direction away from said conveyor belt.

7. The apparatus of claim 6, further comprising a spring between said carriage and said actuator to bias said finger toward said carrier.

8. The apparatus of claim 1, wherein said finger defines an angled surface.

\* \* \* \* \*